US011345095B2

United States Patent
Yang et al.

(10) Patent No.: US 11,345,095 B2
(45) Date of Patent: May 31, 2022

(54) MANUFACTURING PROCESS OF DISPLAY SCREEN COVER

(71) Applicant: ROE Visual Co., Ltd., Shenzhen (CN)

(72) Inventors: Jinbo Yang, Shenzhen (CN); Longjun Liu, Shenzhen (CN); Zhongjin Wang, Shenzhen (CN); Guobin Zhang, Shenzhen (CN); Tong Chen, Shenzhen (CN); Jiantao Gao, Shenzhen (CN); Chen Lu, Shenzhen (CN)

(73) Assignee: ROE Visual Co., Ltd., Shenzhen (CN)

( * ) Notice: Subject to any disclaimer, the term of this patent is extended or adjusted under 35 U.S.C. 154(b) by 671 days.

(21) Appl. No.: 16/397,023

(22) Filed: Apr. 29, 2019

(65) Prior Publication Data

US 2020/0023589 A1    Jan. 23, 2020

Related U.S. Application Data

(63) Continuation of application No. PCT/CN2018/096429, filed on Jul. 20, 2018.

(51) Int. Cl.
*B29C 65/48* (2006.01)
*H05K 5/00* (2006.01)
(Continued)

(52) U.S. Cl.
CPC ....... *B29C 65/4845* (2013.01); *H05K 5/0017* (2013.01); *H05K 5/03* (2013.01); *B29K 2663/00* (2013.01); *B29L 2031/3475* (2013.01)

(58) Field of Classification Search
CPC ................ B29C 65/4845; B29C 65/70; B29C 45/14639; B29C 45/14647;
(Continued)

(56) References Cited

U.S. PATENT DOCUMENTS

2011/0108875 A1* 5/2011 Takenaka ............... H01L 33/502
257/E33.059
2011/0156571 A1* 6/2011 Lin ..................... H01L 51/5246
445/44
(Continued)

FOREIGN PATENT DOCUMENTS

CN    101013689 A    8/2007
CN    103198770 A    7/2013
(Continued)

OTHER PUBLICATIONS

Machine translation of CN 108074499 date uknown.*

*Primary Examiner* — John L Goff, II
(74) *Attorney, Agent, or Firm* — Westbridge IP LLC

(57) ABSTRACT

The invention discloses a manufacturing process of a display screen cover, and a display screen. The manufacturing process includes the following steps: S1, providing a lamp panel provided with LED lamp beads; S2, arranging a glue barrier; S3, filling the hollow region of the glue barrier with glue I, and covering the LED lamp beads with the glue I; S4, providing a press plate; S5, curing the glue I; and S6, removing the press plate and the glue barrier. The cover does not need to be additionally assembled on the lamp panel, so that the lamp beads are protected against damage from the cover, and the yield of display screens is increased; and gaps between the lamp beads are completely filled with the cover, so that the lamp beads are fully protected.

20 Claims, 3 Drawing Sheets

(51) Int. Cl.
    *H05K 5/03* (2006.01)
    *B29K 663/00* (2006.01)
    *B29L 31/34* (2006.01)

(58) Field of Classification Search
    CPC .......................... B29C 45/14655; B29C 70/72;
            H05K 5/0017; H05K 5/03; H05K 3/284;
            B29K 2663/00; B29L 2031/3475; H01L
            25/0753; H01L 33/52; H01L 33/54; H01L
            33/56; H01L 21/56; H01L 21/563; H01L
                21/561; H01L 21/565; H01L 21/568;
                H01L 2924/181; H01L 23/28; F16B
                11/006; H04M 1/0249; H04M 1/0266;
                        G09F 9/33; Y10T 29/49146
    USPC ........ 264/272.11–272.21; 156/247; 438/118,
                                                438/127
    See application file for complete search history.

(56) References Cited

U.S. PATENT DOCUMENTS

2013/0001623 A1    1/2013  Wen
2018/0247844 A1*   8/2018  Deng ................ B29C 45/14065

FOREIGN PATENT DOCUMENTS

| CN | 103208241 A    | 7/2013 |
| CN | 108074499 A  * | 5/2018 |
| CN | 108230933 A    | 6/2018 |

* cited by examiner

MANUFACTURING PROCESS OF DISPLAY SCREEN COVER

CROSS-REFERENCE TO RELATED APPLICATIONS

This application is a continuation of International application No. PCT/CN2018/096429 filed on Jul. 20, 2018, which is hereby incorporated by reference in its entirety.

TECHNICAL FIELD

The invention relates to the technical field of LED display screens, in particular to a manufacturing process of a display screen cover, and a display screen.

BACKGROUND

Generally, covers are attached, by manufacturers, to small-pitch display screens (such as display screens having a pixel pitch of 1.6 mm or blow) to protect fragile LED lamp beads in these screens. However, the LED lamp beads are likely to be damaged in the process of attaching the covers to the display screens; and due to the small pitches between the LED lamp beams, holes formed in the covers to allow the LED lamp beads to penetrates through are very small and are densely distributed, which makes the structure of the covers more fragile and results in a very limited protection effect of the covers on the LED lamp beads in actual use. In addition, existing display screen covers are difficult to manufacture and high in cost.

In view of this, it is necessary to provide a novel manufacturing process for display screen covers to overcome the drawbacks mentioned above.

SUMMARY

The technical issue to be settled by the invention is to provide a manufacturing process of a display screen cover to protect LED lamp beads against damage, and to provide a display screen provided with the display screen cover.

According to one technical solution adopted by the invention to settle the above technical issue, the manufacturing process of a display screen cover comprises the following steps:

S1, providing a lamp panel provided with LED lamp beads;

S2, arranging a glue barrier in such a manner that the lamp panel is located in a hollow region of the glue barrier and that the circumferential wall of the lamp panel is attached to the inner wall of the glue barrier;

S3, filling the hollow region of the glue barrier with glue I, and covering the LED lamp beads with the glue I;

S4, providing a press plate, disposing an isolation layer on the upper surface of the glue I or on the bottom surface, close to the glue I, of the press plate, and squeezing, by the weight of the press plate, redundant glue I out via a gap between the glue barrier and the press plate;

S5, curing the glue I; and

S6, removing the press plate and the glue barrier.

According to another technical solution adopted by the invention to settle the above technical issue, the display screen comprises a lamp panel and a cover, wherein the cover is obtained through the above manufacturing process of a display screen cover.

The invention has the following beneficial effects: the display screen cover is cured on the lamp panel with the glue I instead of being additionally assembled on the lamp panel by production workers, so that the LED lamp beads are protected against damage from the display screen cover, and the yield of display screens is increased; and gaps between the LED lamp beads are completely filled with the display screen cover, so that the structural strength of the display screen cover is greatly improved, and the LED lamp beads are fully protected by the display screen cover.

BRIEF DESCRIPTION OF DRAWINGS

These and other aspects will become apparent and more readily appreciated from the following description of the embodiments, taken in conjunction with the accompanying drawings in which.

DETAILED DESCRIPTION OF THE EMBODIMENTS

Figure 1:
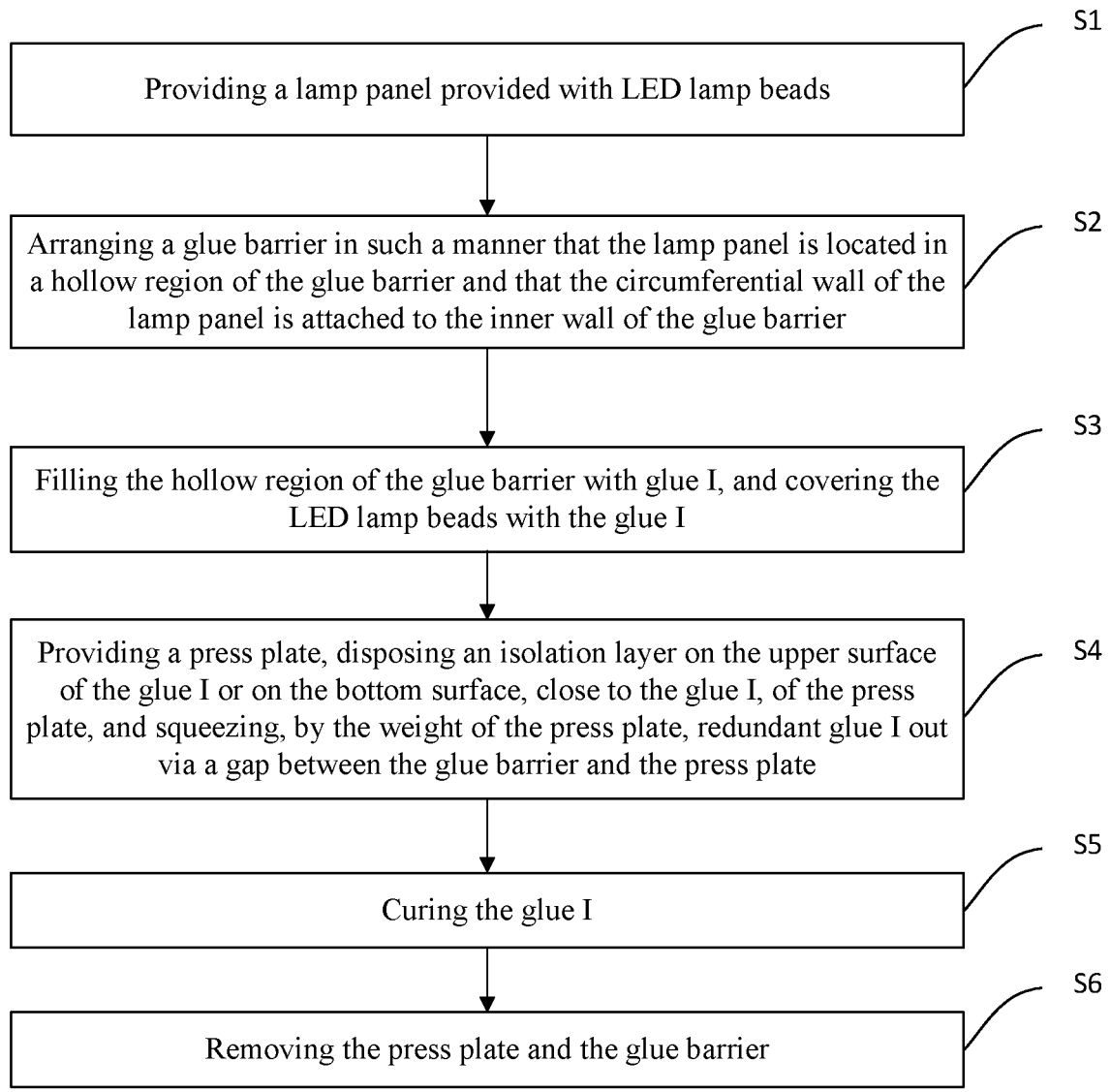
FIG. 1 is a flow diagram of a manufacturing process of a display screen cover of the invention.

The embodiments of the present invention will be described in detail hereinafter, the examples of the embodiments are shown in the accompanying drawings, wherein the same or similar reference numerals throughout the drawings denote the same or similar elements or the elements having the same or similar functions. The embodiments described below with reference to the accompanying drawings are exemplary and are intended to explain the present invention, but cannot be construed as limiting the present invention.

The technical contents of the invention and the objectives and effects to be fulfilled by the invention are detailed below in combination with the accompanying drawings and implementations.

The key concept of the invention lies in that a display screen cover is cured on a lamp panel with glue I instead of being additionally assembled on the lamp panel by production workers, so that LED lamp beams are protected against damage from the display screen cover.

Figure 2:
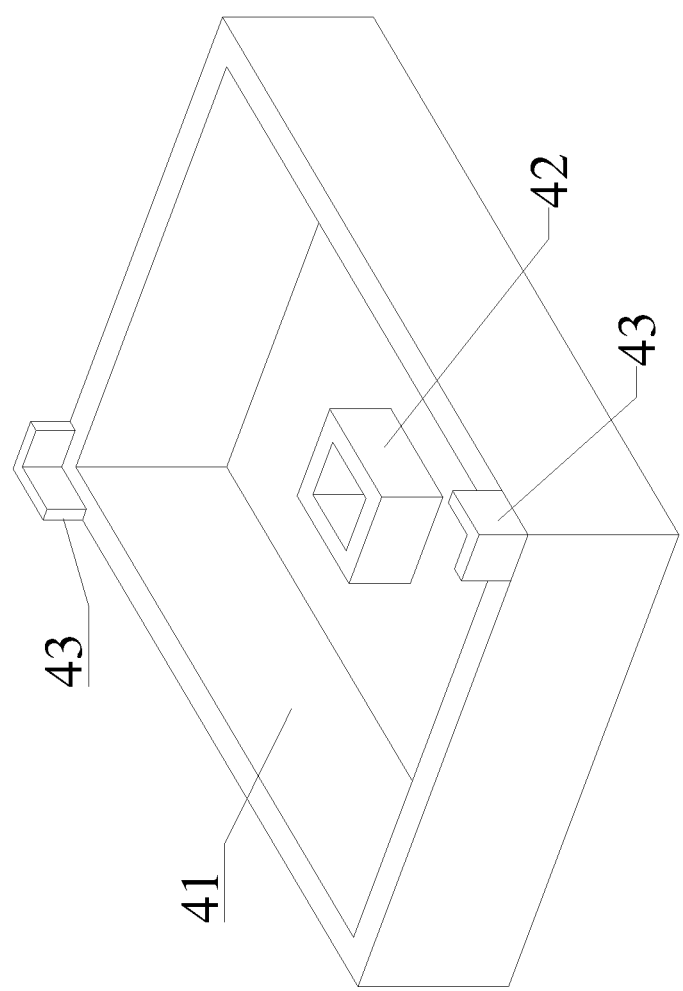
FIG. 2 is a schematic diagram of a support device used during the manufacturing process of a display screen of the invention.
Figure 3:
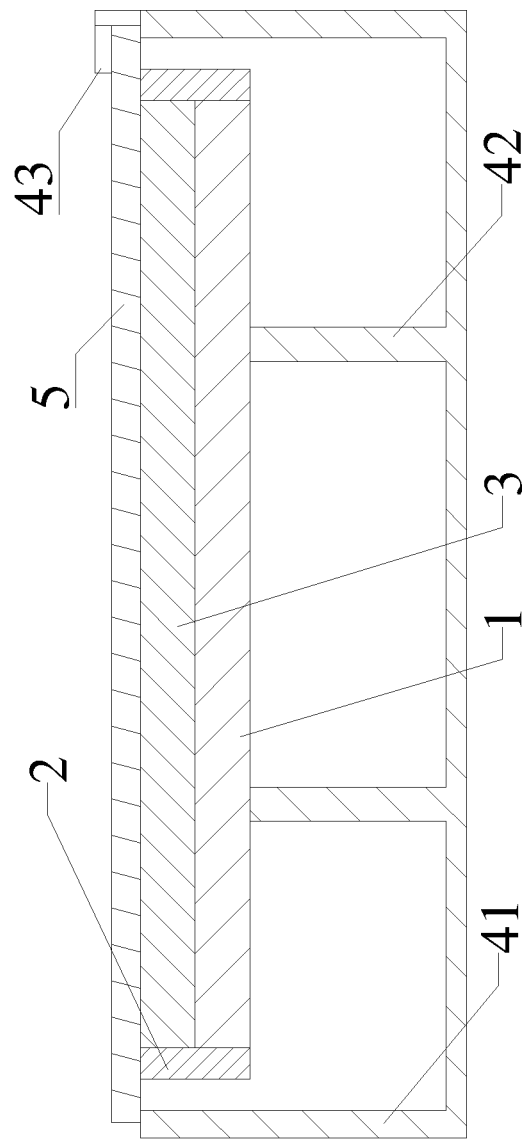
FIG. 3 is a schematic diagram of a press plate used for squeezing out redundant glue I during the manufacturing process of a display screen cover of the invention.

Referring to FIGS. 1-3, a manufacturing process of a display screen cover comprises the following steps:

S1, providing a lamp panel 1 provided with LED lamp beads;

S2, arranging a glue barrier 2 in such a manner that the lamp panel 1 is located in a hollow region of the glue barrier 2 and that the circumferential wall of the lamp panel 1 is attached to the inner wall of the glue barrier 2;

S3, filling the hollow region of the glue barrier with glue I 3, and covering the LED lamp beads with the glue I 3;

S4, providing a press plate 5, disposing an isolation layer on the upper surface of the glue I 3 or on the bottom surface, close to the glue I 3, of the press plate 5, and squeezing, by the weight of the press plate 5, redundant glue I 3 out via a gap between the glue barrier 2 and the press plate 5;

S5, curing the glue I 3; and

S6, removing the press plate 5 and the glue barrier 2.

From the above description, the invention has the following beneficial effects: the display screen cover is cured on the lamp panel with the glue I instead of being additionally assembled on the lamp panel by production workers, so that_ the LED lamp beads are protected against damage from the display screen cover, and the yield of display screens is increased; and gaps between the LED lamp beads are completely filled with the display screen cover, so that the structural strength of the display screen cover is greatly improved, and the LED lamp beads are fully protected by the display screen cover.

Furthermore, step S2 comprises the following step: S21, coating an IC side of the lamp panel 1 with a sealant, and bonding the glue barrier 2 to the lamp panel 1 with the sealant.

From the above description, the IC side of the lamp panel is the circumferential wall of the lamp panel, and the glue barrier and the lamp panel are bonded together with the sealant, so that the glue barrier is prevented from moving, and the glue I is prevented from being left on the IC side of the lamp panel in the subsequent process.

Furthermore, the sealant is two-component mold silicone glue.

From the above description, the two-component mold silicone glue is easy to remove after being cured, so that damage to the lamp panel can be effectively reduced.

Furthermore, after step S21, the following step is executed: S22, placing the lamp panel 1 into curing equipment to be heated.

Furthermore, in step S22, the temperature in the curing equipment maintained at 70-80° C. for 5-10 min.

From the above description, the lamp panel is preheated to cure the glue I more rapidly, so that production efficiency is improved.

Furthermore, the glue barrier 2 is defined by a plurality of limiting sheets.

Furthermore, a gap between every two adjacent limiting sheets is sealed with glue II and/or high-temperature tape.

From the above description, the gap between every two adjacent limiting sheets is sealed with the glue II and/or high-temperature tape, so that the glue I can be prevented from leaking out via the gaps in the subsequent filling process.

Furthermore, the glue barrier 2 is a metal frame.

Furthermore, the metal frame is provided with a connector to be connected with the lamp panel 1.

Furthermore, before step S4, the following step is executed: S41, placing the lamp panel 1 in vacuum equipment to be vacuumized.

Furthermore, the lamp panel 1 is vacuumized in the vacuum equipment at a rate of 60-80 L/s for 15S-60S.

From the above description, bubbles in the glue I can be eliminated by vacuumization, and accordingly, the quality of the cured display screen cover is improved.

Furthermore, the isolation layer is a release film, and after step S6, the following step is executed: S61, removing the release film.

Furthermore, the isolation layer is a polytetrafluoroethylene coating disposed on the bottom surface, close to the glue I 3, of the press plate 5.

From the above description, the isolation layer can prevent non-cured glue I from adhering to the press plate, so that the display screen cover will not be damaged when the press plate is removed in the subsequent process.

Furthermore, the glue I 3 is single-component glue or two-component glue.

From the above description, manufacturers can select the proper glue I from various types of glue I according to actual requirements.

Furthermore, step S5 comprises the following step: S51, placing the lamp panel 1 together with the press plate 5 into the curing equipment to be heated and cured, and maintaining the curing equipment at a certain temperature.

Furthermore, in step S51, the temperature in the curing equipment maintained at 60±10° C. for 1.5H-2H.

From the above description, the glue I is heated to be cured more rapidly, so that the production speed of the display screen cover is increased.

Furthermore, step S6 comprises the following step: S61', removing the press plate 5, heating the curing equipment, and maintaining the curing equipment at a certain temperature.

Furthermore, in step S61', the temperature in the curing equipment is maintained at 80±10° C. for 2H-2.5H.

From the above description, after the press plate is removed, the temperature in the curing equipment is increased to completely cure the glue I, and then the display screen cover is obtained.

Furthermore, the glue I is UV glue.

Furthermore, step S5 comprises the following step: S51', irradiating the glue I by a UV lamp.

Furthermore, before step S3, the following step is executed: S31, placing the lamp panel 1 on a support device, and suspending the lamp panel 1 with the LED lamp beads facing upwards.

Furthermore, the support device comprises an outer support 41, a bottom plate arranged at the bottom of the outer support 41 and an inner support 42 arranged on the inner side of the bottom plate on the outer support 41, the inner support 42 is spaced from the outer support 41, and a baffle 43 used for preventing the press plate 5 from sliding is arranged at the top of the outer support 41.

Furthermore, in step S31, four edges of the lamp panel 1 are all suspended after the lamp panel 1 is placed on the inner support 42.

Furthermore, in step S4, the press plate 5 abuts against the top surface of the support device after squeezing out redundant glue.

Furthermore, the top surface of the glue barrier 2 is flush with the top surfaces of the LED lamp beads.

Furthermore, after step S6, the following step is executed: S62, cutting the lamp panel 1 in a specific shape.

A display screen comprises a lamp panel and a cover, wherein the cover is obtained through the above manufacturing process of a display screen cover.

Furthermore, the display screen further comprises a bottom shell, wherein the lamp panel is fixedly connected with the bottom shell, a power signal adapter plate is arranged in the bottom shell, and the lamp panel is electrically connected with the power signal adapter plate.

Embodiment 1

Referring to FIGS. 1-3, in embodiment 1 of the invention, the manufacturing process of a display screen cover comprises the following steps:

S1, a lamp panel 1 provided with LED lamp beads is provided;

S2, a glue barrier 2 is arranged in such a manner that the lamp panel 1 is located in a hollow region of the glue barrier 2 and that the circumferential wall of the lamp panel 1 is attached to the inner wall of the glue barrier 2;

S3, the hollow region of the glue barrier 2 is filled with glue I 3, and the LED lamp beads are covered with the glue I 3;

S4, a press plate 5 is provided, an isolation layer is disposed on the upper surface of the glue I 3 or on the bottom surface, close to the glue I 3, of the press plate 5, and redundant glue I 3 is squeezed out via a gap between the glue barrier 2 and the press plate 5 by the weight of the press plate 5;

S5, the glue I 3 is cured; and

S6, the press plate 5 and the glue barrier 2 are removed.

In step S1, matte-black nano gloss oil is uniformly sprayed between the LED lamp beads of the lamp panel 1 in advance, then the lamp panel 1 is placed in curing equipment (such as an oven), and the curing equipment is heated to 60-90° C. and is maintained at this temperature for 20-30 min to cure the gloss oil to realize a matte effect, so that the contrast of the lamp panel 1 is increased, and the blank-screen consistency is ensured.

In this embodiment, the glue barrier 2 is defined by a plurality of limiting sheets which are PVC sheets, Mylar sheets or the like. Furthermore, a gap between every two adjacent limiting sheets is sealed with glue II (not shown) and/or high-temperature tape (not shown). The gaps are sealed with the glue II and/or the high-temperature tape, so that the limiting sheets are prevented from moving, and the glue I 3 is prevented from leaking out. In other embodiments, the glue barrier 2 can be an external metal frame provided with a connector (such as a screw or a buckle) to be connected with the lamp panel 1.

Step S2 comprises the following steps: S21, an IC side of the lamp panel 1 is coated with a sealant, and the glue barrier 2 is bonded to the lamp panel 1 with the sealant, wherein the sealant is preferably two-component mold silicone glue; and S22 to be executed after step S21, the lamp panel 1 is placed in the curing equipment to be heated, and the temperature in the curing equipment is maintained at 70-80° C. for 5-10 min to cure the sealant.

In order to eliminate bubbles in the glue I 3, the following step is executed before step S4: S41, the lamp panel 1 is placed in vacuum equipment to be vacuumized at a rate of 60-80 L/S for 15S-60S.

When the isolation layer is a release film, the following step is executed after step S6: S61, the release film is removed. When the isolation layer is a non-sticky coating (such as a polytetrafluoroethylene coating), the non-sticky coating (such as the polytetrafluoroethylene coating) is disposed on the bottom surface, close to the glue I 3, of the press plate 5.

Particularly, the glue I 3 is single-component glue or two-component glue.

Step S5 comprises the following step: S51, the lamp panel 1 together with the press plate 5 is placed in the curing equipment to be heated and cured, and the temperature in the curing equipment maintained at 60±10° C. for 1.5H-2H.

Step S6 comprises the following step: S61', the press plate 5 is removed, and the temperature in the curing equipment is increased and is maintained at 80±10° C. for 2H-2.5H.

Furthermore, the following step is executed before step S3: S31, the lamp panel 1 is placed on a support device and is suspended with the LED lamp beads facing upwards.

In this embodiment, the support device comprises an outer support 41, a bottom plate arranged at the bottom of the outer support and an inner support 42 arranged on the inner side of the bottom plate on the outer support 41, wherein the inner support 42 is spaced from the outer support 41, and a baffle 43 used for preventing the press plate 5 from sliding is arranged at the top of the outer support 41. After the lamp panel 1 is placed on the inner support 42, four edges of the lamp panel 1 are all suspended, which means that the lamp panel 1 does not make contact with the outer support 41. After glue filling, redundant glue I 3 flows out of the outer edge of the lamp panel 1 and then directly falls onto the support device, so that the glue I 3 is prevented from being left on the IC side of the lamp panel 1, which may otherwise affect normal work of the lamp panel 1.

In step S4, the press plate 5 abuts against the top surface of the support device after squeezing out redundant glue, and particularly, the press plate 5 abuts against the top surface of the outer support 41 after squeezing out the redundant glue. The support device can support the press plate 5, so that the LED lamp beads are protected against crushing damage from the press plate 5.

The top surface of the glue barrier 2 is flush with the top surfaces of the LED lamp beads.

After step S6, the following step is executed: S62, the lamp panel 1 is cut in a specific shape.

A display screen comprises a bottom shell, a lamp panel and a cover, wherein the lamp panel is fixedly connected with the bottom shell, a power signal adapter plate is arranged in the bottom shell, the lamp panel 1 is electrically connected with the power signal adapter plate, and the cover is obtained through the above manufacturing process of a display screen cover.

By adoption of the this technical solution, an external destructive force to the LED lamp beads is avoided in the operating process; after the process is completed, the LED lamp beads are completely covered with transparent or semi-transparent high-molecular polymers, such as epoxy resin, which form a hard cover protection layer with the hardness reaching shore 70 D or above or form a soft cover protection layer with the hardness reaching shore 50 A or above, so that the product is effectively prevented from being damaged in the subsequent procedure and can be touched with naked hands; the epoxy resin is transparent and has no influence on brightness, chromaticity coordinates, color temperature and the like, so that the visual angle of the LED lamp beads is expanded to 0°-180°; and the LED lamp beads are well protected and are prevented against water, so that the visual angle of the LED lamp beads is further expanded. The display screen cover manufactured in this technical solution is simple in structure, practical, convenient to use, stable in overall structure, light, thin and durable.

Embodiment 2

On the basis of embodiment 1, embodiment 2 of the invention provides another technical solution of the glue I. Different from embodiment 1, the glue I is UV glue in this embodiment.

The manufacturing process of a display screen cover comprises the following steps:

S1, a lamp panel provided with LED lamp beads is provided;

S2, a glue barrier is arranged in such a manner that the lamp panel is located in a hollow region of the glue barrier and that the circumferential wall of the lamp panel is attached to the inner wall of the glue barrier;

S3, the hollow region of the glue barrier is filled with UV glue, and the LED lamp beads are covered with the UV glue;

S4, a transparent press plate is provided, an isolation layer is arranged on the upper surface of the UV glue or on the bottom surface, close to the UV glue, of the transparent press plate, and redundant UV glue is squeezed out via a gap between the glue barrier and the press plate by the weight of the press plate;

S5, the glue I 3 is cured; and

S6, the press plate 5 and the glue barrier 2 are removed.

Step S5 comprises the following step: S51', the UV glue is irradiated by a UV lamp.

Preferably, in step S1, matte-black nano gloss oil is uniformly sprayed between the LED lamp beads of the lamp panel in advance, then the lamp panel is placed in curing equipment (such as an oven), and the curing equipment is heated to 60-90° C. and is maintained at this temperature for 20-30 min to cure the gloss oil to realize a matte effect, so that the contrast of the lamp panel is increased, and the blank-screen consistency is ensured.

A display screen comprises a bottom shell, a lamp panel and a cover, wherein the lamp panel is fixedly connected with the bottom shell, a power signal adapter plate is arranged in the bottom shell, the lamp panel is electrically connected with the power signal adapter plate, and the cover is obtained through the above manufacturing process of a display screen cover.

Embodiment 3

According to the manufacturing process of a display screen cover in embodiment 3 of the invention, matte-black nano gloss oil is uniformly sprayed between the LED lamp beads of the lamp panel in advance, then the lamp panel is placed in an oven, and the oven is heated to 60-90° C. and is maintained at this temperature for 20-30 min to cure the gloss oil to realize a matte effect, so that the contrast of the lamp panel is increased, and the blank-screen consistency is ensured.

The lamp panel is taken out, and limiting sheets are continuously arranged on the periphery of the lamp panel and are stretched out to be flush with an illumination side of the lamp panel. Particularly, a gap between every two adjacent limiting sheets is sealed with glue II and/or high-temperature tape, so that the glue is prevented from leaking out after being filled into the gaps between the limiting sheets. Preferably, the limiting sheets are PVC sheets, Mylar sheets or the like.

Preferably, after the joint of the limiting sheets and the IC side of the lamp panel is coated with two-component mold silicone glue, the lamp panel is placed in an oven at a temperature of 70-80° C., is maintained in the oven for 5-10 min and is then taken out, so that the gaps between the limiting sheets and the lamp panel are completely sealed; after the two-component mold silicone glue is heated to be cured, the limiting sheets can be prevented from moving when pressed, and the probability of glue leakage is lowered; and the two-component mold silicone glue can be taken out easily after being cured, so that damage to the lamp panel is effectively reduced.

The lamp panel is placed on a support device (the support device in this embodiment is structurally identical with the support device in embodiment 1), and the whole lamp panel is suspended with the illumination side facing outwards; and the two-component glue is prepared in proportion and is mixed for over 1 min through a mixer, and after the two-component glue is sufficiently mixed, glue I is obtained and is poured onto the surfaces of the LED lamp beads of the lamp panel. The glue I is uniformly spread when poured onto the surfaces of the LED lamp beads to make sure that the LED lamp beads are completely covered with the glue I.

The lamp panel together with the support device is placed in vacuum equipment to be vacuumized, and glue bubbles on the illumination side are completely eliminated after the pressure is released. Preferably, the lamp panel is vacuumized in the vacuum equipment at a rate of 70 L/S for 15S-60S.

The lamp panel and the support device are taken out, and a release surface of a release film is attached to a glue surface formed by the glue I in a manner of attaching films to mobile phones; the upper surface of the release film is covered with a transparent plate with the flatness of 0.05 mm and the thickness not smaller than 10 mm, the periphery of the transparent plate is fixed by the support device on which the lamp panel is placed, and the support device is provided with a baffle for preventing the transparent plate from sliding, so that the release film is tightly attached to the top surfaces of the LED lamp beads, redundant glue I is squeezed out by gravity via the gaps between the transparent plate and the limiting sheets, and the transparent plate is exactly supported by the limiting sheets and makes full contact with the glue I; and the glue I is limited by the limiting sheets, so that the flow range of the glue is limited.

The lamp panel, the support device, the transparent plate and the release film are placed in an oven at a temperature of 60±10° C. and are maintained in the oven for 1.5H-2H, so that the glue I is primarily cured.

After being maintained at the temperature of 60±10° C. for 1.5H-2H, the transparent plate is taken out the gravity is removed, and then the oven is heated to 80±10° C. and is maintained at this temperature for 2-2.5H, so that the glue I is further cured. After being cured, the glue I has the hardness over shore 70 D. Comprehensibly, the glue I can also be cured at a normal temperature.

Afterwards, the lamp panel is taken out, the release film on the lamp panel is removed, the limiting sheets and redundant glue I on the lamp panel are cleared away, then the lamp panel is moved to a normal-temperature position, and after the lamp panel is cooled to the normal temperature, the thickness deviation of the glue is smaller than 0.1 mm.

The lamp panel can be cut by a high-precision engraving machine or a wafer scriber by a specific boundary dimension, so as to meet the requirements for lamp panels having different sizes and applied to products with different sizes and shapes.

A display screen comprises a bottom shell, a lamp panel and a cover, wherein the lamp panel is fixedly connected with the bottom shell, a power signal adapter plate is arranged in the bottom shell, the lamp panel is electrically connected with the power signal adapter plate, and the cover is obtained through the above manufacturing process of a display screen cover.

Embodiment 4

On the basis of embodiment 3, embodiment 4 of the invention provides another technical solution, which is different from embodiment 3 in that the glue I is a single-component glue. Particularly, according to the manufacturing process of a display screen cover in this embodiment, matte-black nano gloss oil is uniformly sprayed between the LED lamp beads of the lamp panel in advance, then the lamp panel is placed in an oven, and the oven is heated to 60-90° C. and is maintained at this temperature for 20-30 min to cure the gloss oil to realize a matte effect, so that the contrast of the lamp panel is increased, and the blank-screen consistency is ensured.

The lamp panel is taken out, and limiting sheets are continuously arranged on the periphery of the lamp panel and are stretched out to be flush with an illumination side of the lamp panel. Particularly, a gap between every two adjacent limiting sheets is sealed with glue II and/or high-temperature tape, so that the glue is prevented from leaking out after being filled into the gaps between the limiting sheets. Preferably, the limiting sheets are PVC sheets, Mylar sheets or the like.

Preferably, after the joint of the limiting sheets and the IC side of the lamp panel is coated with two-component mold silicone glue, the lamp panel is placed in an oven at a temperature of 70-80° C., is maintained in the oven for 5-10 min and is then taken out, so that the gaps between the limiting sheets and the lamp panel are completely sealed; after the two-component mold silicone glue is heated to be cured, the limiting sheets can be prevented from moving when pressed, and the probability of glue leakage is lowered; and the two-component mold silicone glue can be taken out easily after being cured, so that damage to the lamp panel is effectively reduced.

The lamp panel is placed on a support device (the support device in this embodiment is structurally identical with the support device in embodiment 1), and the whole lamp panel is suspended with the illumination side facing outwards; and single-component glue (with the viscosity of 500-1200), namely glue I, is poured onto the surfaces of the LED lamp beads of the lamp panel. The glue I is uniformly spread when poured onto the surfaces of the LED lamp beads to make sure that the LED lamp beads are completely covered with the glue I.

After the glue I is primarily cured, a release surface of a release film is attached to a glue surface formed by the glue I in a manner of attaching films to mobile phones; the upper surface of the release film is covered with a transparent plate with the flatness of 0.05 mm and the thickness not smaller than 10 mm, the periphery of the transparent plate is fixed by the support device on which the lamp panel is placed, and the support device is provided with a baffle for preventing the transparent plate from sliding, so that the release film is tightly attached to the top surfaces of the LED lamp beads, redundant glue I is squeezed out by gravity via the gaps between the transparent plate and the limiting sheets, and the transparent plate is exactly supported by the limiting sheets and makes full contact with the glue I; and the glue I is limited by the limiting sheets, so that the flow range of the glue is limited.

The lamp panel, the support device, the transparent plate and the release film are placed in an oven at a temperature of 60-120° C. and are maintained in the oven for over 2H, so that the glue I is completely cured.

Afterwards, the lamp panel is taken out, the release film on the lamp panel is removed, the limiting sheets and redundant glue I on the lamp panel are cleared away, then the lamp panel is moved to a normal-temperature position, and after the lamp panel is cooled to the normal temperature, the thickness deviation of the glue is smaller than 0.1 mm.

The lamp panel can be cut by a high-precision engraving machine or a wafer scriber by a specific boundary dimension, so as to meet the requirements for lamp panels having different sizes and applied to products with different sizes and shapes.

A display screen comprises a bottom shell, a lamp panel and a cover, wherein the lamp panel is fixedly connected with the bottom shell, a power signal adapter plate is arranged in the bottom shell, the lamp panel is electrically connected with the power signal adapter plate, and the cover is obtained through the above manufacturing process of the display screen cover.

According to the manufacturing process of a display screen cover, and the display screen, an external destructive force to the LED lamp beads is avoided in the operating process; after the process is completed, the LED lamp beads are completely covered with transparent or semi-transparent high-molecular polymers, such as epoxy resin, which form a hard cover protection layer with the hardness reaching shore 70 D or above or form a soft cover protection layer with the hardness reaching shore 50 A or above, so that the product is effectively prevented from being damaged in the subsequent procedure and can be touched with naked hands; the epoxy resin is transparent and has no influence on brightness, chromaticity coordinates, color temperature and the like; as the matte-black nano gloss oil is sprayed to the bottom of a PCB before glue filling to fulfill a uniform color of the PCB and a proper contrast between the bottom of the black PCB and the white illumination color of the LED lamp beads, the blank-screen consistency is ensured, reflective light generated by illumination is reduced. Traditional covers limit the light angle of LED lamps to a certain extent. Different from existing LED lamps provided with covers, a transparent cover is adopted in technical solutions of the invention, so that the visual angle of the LED lamp beads is directly expanded to 0°-180°, and the display contrast is ensured; the LED lamp beads are well protected and are prevented against water, the display effect is ensured, and the visual angle of the LED lamp beads is expanded; and the gaps between the LED lamp beads are completely filled with the display screen cover, so that the structural strength of the display screen cover is greatly improved, and the LED lamp beads are fully protected by the display screen cover.

The above embodiments are only illustrative ones of the invention and are not intended to limit the patent scope of the invention. All equivalent transformations obtained based on the contents in the description and the drawings, or direct or indirect applications to relevant technical fields should also fall within the patent protection scope of the invention.

What is claimed is:

1. A manufacturing process of a display screen cover, comprising the following steps:
    S1, providing a lamp panel provided with light emitting diode (LED) lamp beads;
    S2, arranging a glue barrier in such a manner that the lamp panel is located in a hollow region of the glue barrier and that a circumferential wall of the lamp panel is attached to an inner wall of the glue barrier;
    S3, filling the hollow region of the glue barrier with glue I, and covering the LED lamp beads with the glue I;
    S4, providing a press plate, disposing an isolation layer on an upper surface of the glue I or on a bottom surface, close to the glue I, of the press plate, and squeezing, by a weight of the press plate, redundant glue I out via a gap between the glue barrier and the press plate;
    S5, curing the glue I; and
    S6, removing the press plate and the glue barrier.

2. The manufacturing process of a display screen cover according to claim 1, wherein step S2 comprises the following step: S21, coating an integrated circuit (IC) side of the lamp panel with a sealant, and bonding the glue barrier to the lamp panel with the sealant.

3. The manufacturing process of a display screen cover according to claim 2, wherein the sealant is two-component mold silicone glue.

4. The manufacturing process of a display screen cover according to claim 2, wherein after step S21, the following step is executed: S22, placing the lamp panel into curing equipment to be heated.

5. The manufacturing process of a display screen cover according to claim 4, wherein in step S22, a temperature in the curing equipment is maintained at 70-80° C. for 5-10 min.

6. The manufacturing process of a display screen cover according to claim 2, wherein the glue barrier is defined by a plurality of limiting sheets.

7. The manufacturing process of a display screen cover according to claim 6, wherein a gap between every two adjacent said limiting sheets is sealed with glue II and/or tape.

8. The manufacturing process of a display screen cover according to claim 2, wherein the glue barrier is a metal frame.

9. The manufacturing process of a display screen cover according to claim 8, wherein the metal frame is provided with a connector to be connected with the lamp panel.

10. The manufacturing process of a display screen cover according to claim 1, wherein before step S4, the following step is executed: S41, placing the lamp panel in vacuum equipment to be vacuumized.

11. The manufacturing process of a display screen cover according to claim 10, wherein the lamp panel is vacuumized in the vacuum equipment at a rate of 60-80 L/s for 15 s-60 s.

12. The manufacturing process of a display screen cover according to claim 10, wherein the isolation layer is a release film, and after step S6, the following step is executed: S61, removing the release film.

13. The manufacturing process of a display screen cover according to claim 10, wherein the isolation layer is a polytetrafluoroethylene coating disposed on the bottom surface, close to the glue I, of the press plate.

14. The manufacturing process of a display screen cover according to claim 1, wherein the glue I is single-component glue or two-component glue.

15. The manufacturing process of a display screen cover according to claim 14, wherein step S5 comprises the following step: S51, placing the lamp panel together with the press plate into curing equipment to be heated and cured, and maintaining the curing equipment at a certain temperature.

16. The manufacturing process of a display screen cover according to claim 15, wherein in step S51, the temperature in the curing equipment is maintained at 60±10° C. for 1.5H-2H.

17. The manufacturing process of a display screen cover according to claim 15, wherein step S6 comprises the following step: S61', removing the press plate, heating the curing equipment, and maintaining the curing equipment at a certain temperature.

18. The manufacturing process of a display screen cover according to claim 17, wherein in step S61', the temperature in the curing equipment is maintained at 80±10° C. for 2H-2.5H.

19. The manufacturing process of a display screen cover according to claim 1, wherein the glue I is ultraviolet (UV) glue.

20. The manufacturing process of a display screen cover according to claim 19, wherein step S5 comprises the following step: S51', irradiating the glue I by a UV lamp.

* * * * *